US012575222B2

(12) United States Patent
Brune

(10) Patent No.: US 12,575,222 B2
(45) Date of Patent: Mar. 10, 2026

(54) MICROELECTRONIC DEVICE TRANSFER WITH UV-TRANSMISSIVE ADHESIVE AND LASER LIFT-OFF

(71) Applicant: Coherent LaserSystems GmbH & Co. KG, Göttingen (DE)

(72) Inventor: Jan Brune, Dassel (DE)

(73) Assignee: Coherent LaserSystems GmbH & Co. KG, Göttingen (DE)

( * ) Notice: Subject to any disclaimer, the term of this patent is extended or adjusted under 35 U.S.C. 154(b) by 329 days.

(21) Appl. No.: 18/272,930

(22) PCT Filed: Jan. 7, 2022

(86) PCT No.: PCT/EP2022/050274
§ 371 (c)(1),
(2) Date: Jul. 18, 2023

(87) PCT Pub. No.: WO2022/157017
PCT Pub. Date: Jul. 28, 2022

(65) Prior Publication Data
US 2024/0088323 A1 Mar. 14, 2024

Related U.S. Application Data

(60) Provisional application No. 63/139,660, filed on Jan. 20, 2021.

(51) Int. Cl.
*H10H 20/01* (2025.01)
(52) U.S. Cl.
CPC .......... *H10H 20/01* (2025.01); *H10H 20/018* (2025.01)
(58) Field of Classification Search
None
See application file for complete search history.

(56) References Cited

U.S. PATENT DOCUMENTS 10,446,720 B2 * 10/2019 Hsu ..................... H10H 20/832
11,417,799 B2 * 8/2022 Chu .................... H10H 20/018
(Continued)

FOREIGN PATENT DOCUMENTS

EP 3387882 B1 5/2021

OTHER PUBLICATIONS

Banks et al., (2008). "Triazene photopolymer dynamic release layer-assisted femtosecond laser-induced forward transfer with an active carrier substrate," EPL, 83:38003, 6 pages.
(Continued)

*Primary Examiner* — Bradley Smith
(74) *Attorney, Agent, or Firm* — Morrison & Foerster LLP

(57) ABSTRACT

A method for inter-substrate transfer of microelectronic devices includes applying a polymer coating to a top surface of a microelectronic device located on a first substrate, depositing an ultraviolet-transmissive adhesive on a second substrate, contacting the polymer-coated top surface of the microelectronic device to the adhesive to bond the microelectronic device to the second substrate, detaching the microelectronic device from the first substrate, and, while the bottom surface of the microelectronic device faces a third substrate, irradiating and ablating the polymer coating with ultraviolet laser light through the second substrate and the adhesive to transfer the microelectronic device from the second substrate to the third substrate via laser lift-off. The method allows for use of ultraviolet-transmissive adhesives, with the polymer coating protecting the microelectronic device from damage by ultraviolet light that, in the absence of the polymer coating, would be transmitted by the adhesive during laser lift off.

20 Claims, 8 Drawing Sheets

(56)         References Cited

U.S. PATENT DOCUMENTS

| | | | |
|---|---|---|---|
| 2018/0068995 A1 | 3/2018 | Kajiyama | |
| 2018/0204973 A1 | 7/2018 | Jeung et al. | |
| 2019/0393069 A1 | 12/2019 | Paranjpe et al. | |
| 2023/0369533 A1* | 11/2023 | Huang | H10H 20/018 |
| 2025/0151492 A1* | 5/2025 | Senczuk | B08B 7/0042 |

OTHER PUBLICATIONS

Fardel et al., (2007). "Fabrication of organic light-emitting diode pixels by laser-assisted forward transfer," Applied Physics Letters, 91:061103, 3 pages.

International Search Report and Written Opinion received for International Patent Application No. PCT/EP2022/050274 mailed on Apr. 26, 2022, 12 pages.

Porneala et al., (2016). "Selective Removal Of Conformal Coatings By Pulsed Ultraviolet Lasers," Proceedings of SMTA International, 312-317.

Schmiedel et al., (2009). "Combined Plasma Laser Removal of Parylene Coatings," U Gottingen, 4 pages.

Stewart et al., (2010). "Laser-Induced Forward Transfer Using Triazene Polymer Dynamic Releaser Layer," AIP Conf. Proc., 1278(1):789-799.

* cited by examiner

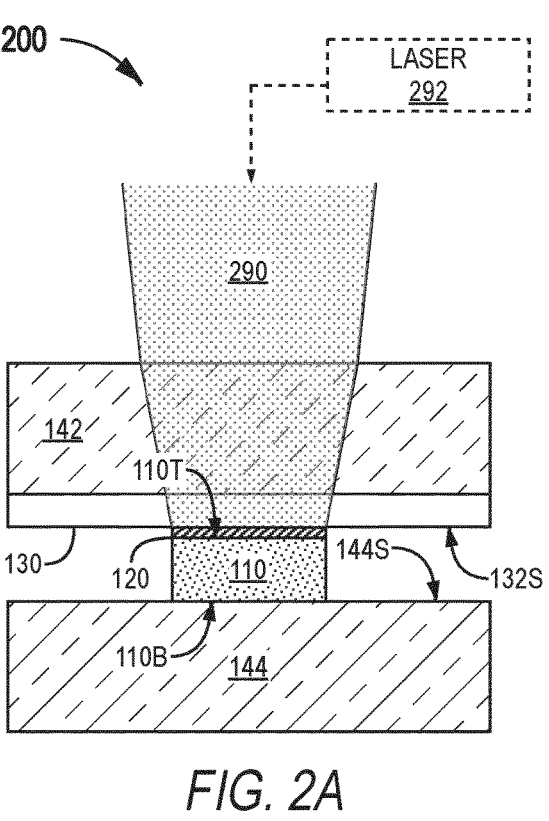
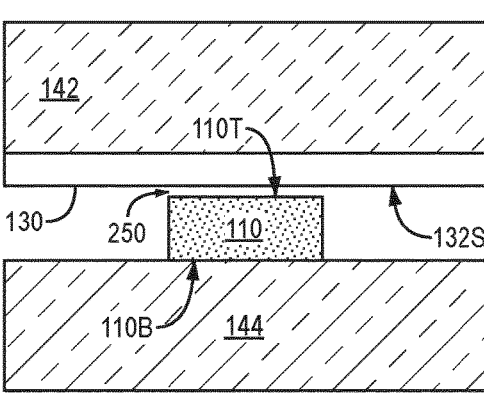
FIG. 2A                        FIG. 2B
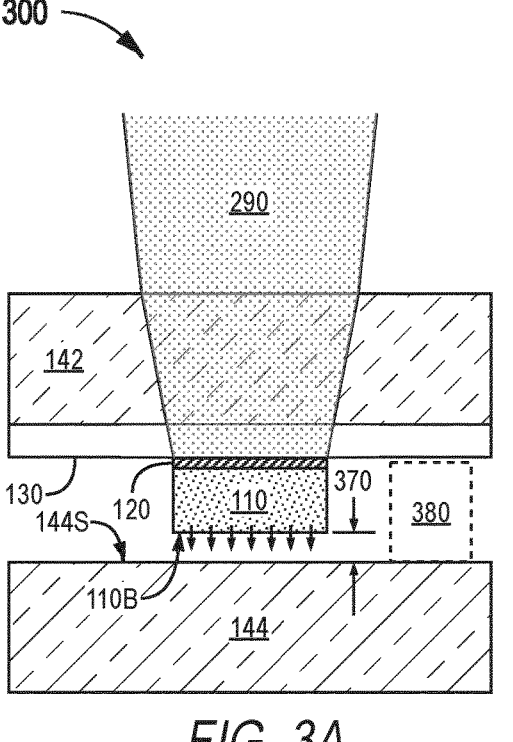
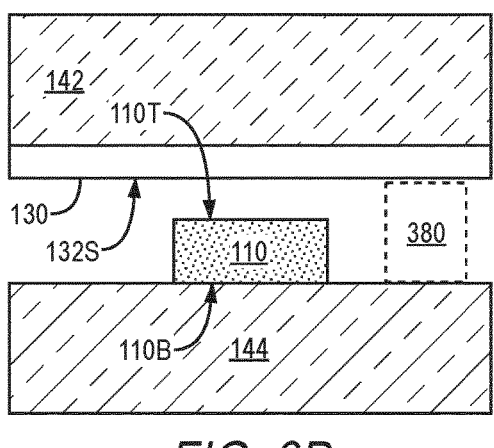
FIG. 3A                        FIG. 3B

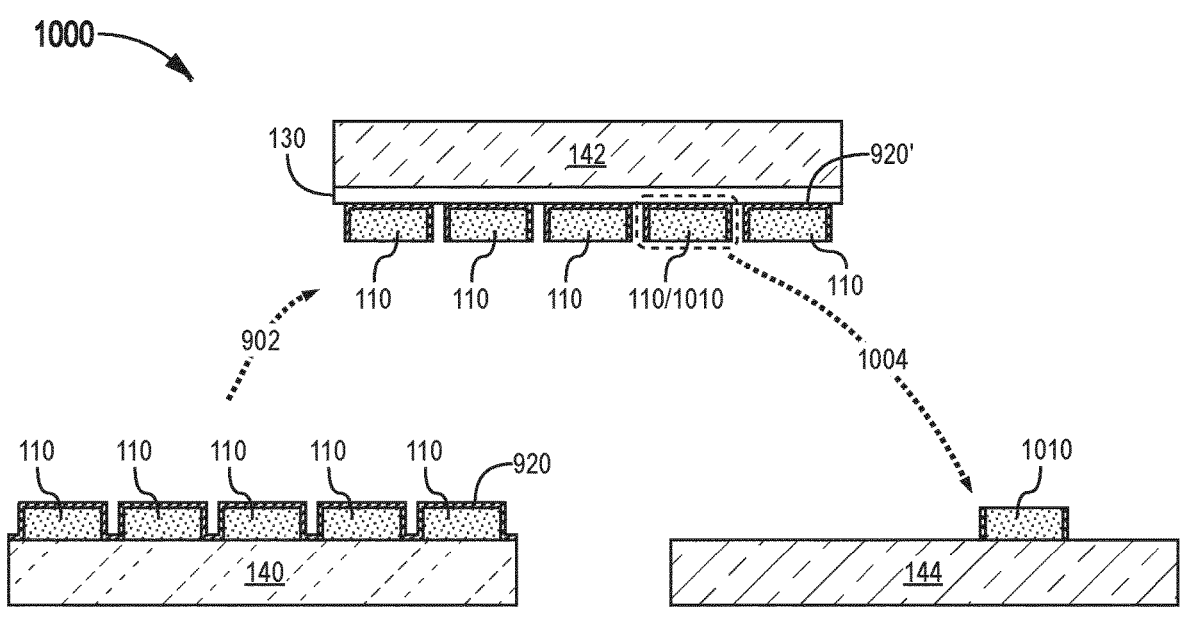
FIG. 10
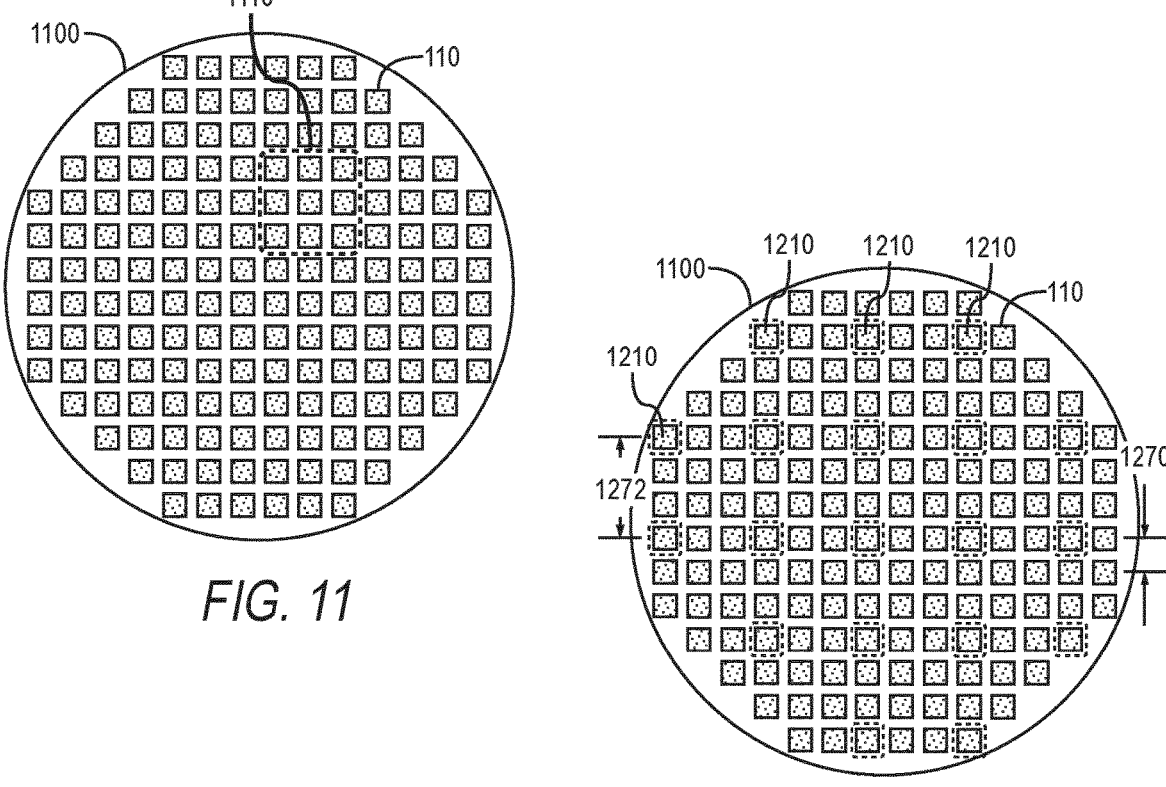
FIG. 11
FIG. 12

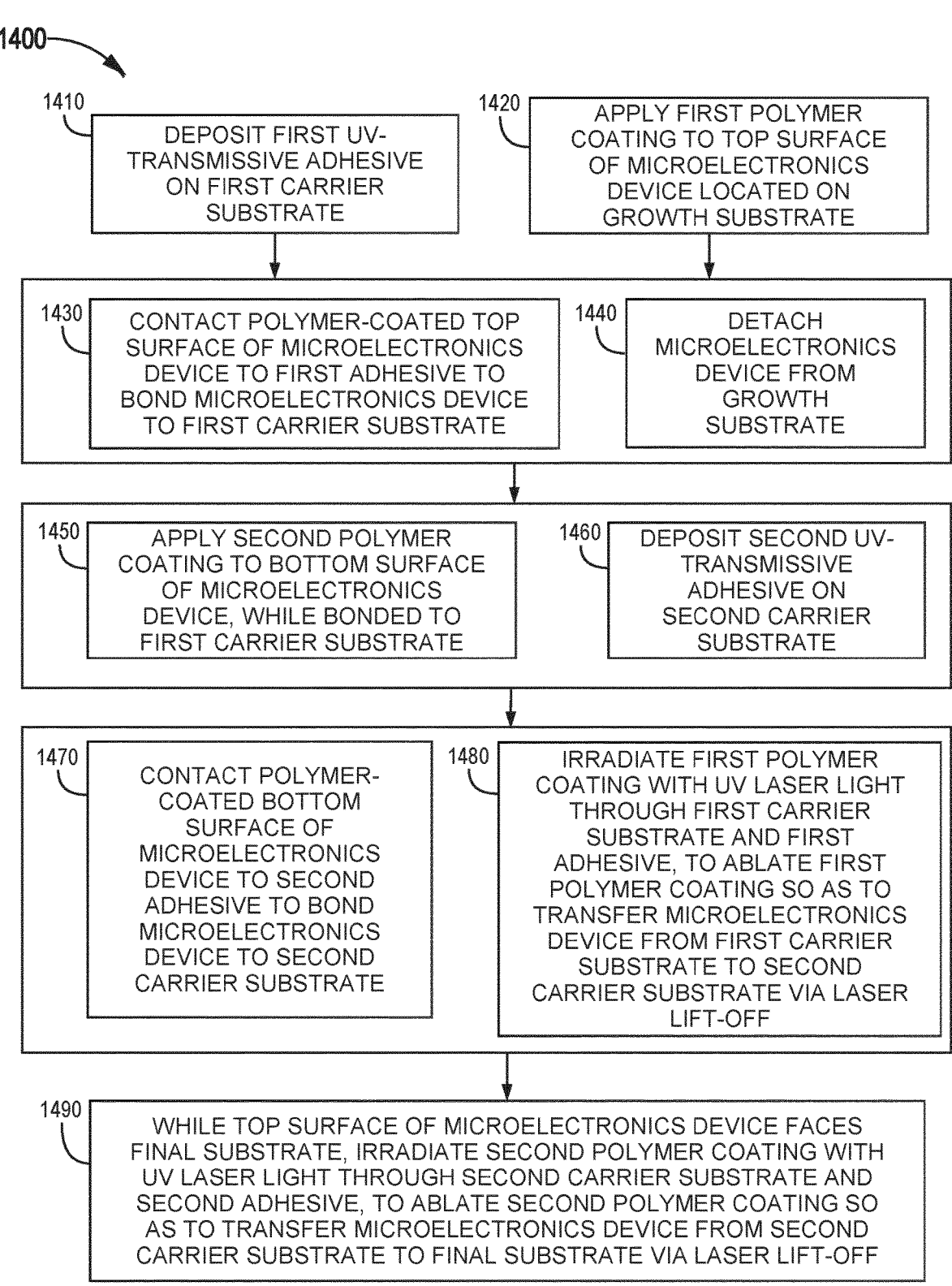

1400

1410 DEPOSIT FIRST UV-TRANSMISSIVE ADHESIVE ON FIRST CARRIER SUBSTRATE

1420 APPLY FIRST POLYMER COATING TO TOP SURFACE OF MICROELECTRONICS DEVICE LOCATED ON GROWTH SUBSTRATE

1430 CONTACT POLYMER-COATED TOP SURFACE OF MICROELECTRONICS DEVICE TO FIRST ADHESIVE TO BOND MICROELECTRONICS DEVICE TO FIRST CARRIER SUBSTRATE

1440 DETACH MICROELECTRONICS DEVICE FROM GROWTH SUBSTRATE

1450 APPLY SECOND POLYMER COATING TO BOTTOM SURFACE OF MICROELECTRONICS DEVICE, WHILE BONDED TO FIRST CARRIER SUBSTRATE

1460 DEPOSIT SECOND UV-TRANSMISSIVE ADHESIVE ON SECOND CARRIER SUBSTRATE

1470 CONTACT POLYMER-COATED BOTTOM SURFACE OF MICROELECTRONICS DEVICE TO SECOND ADHESIVE TO BOND MICROELECTRONICS DEVICE TO SECOND CARRIER SUBSTRATE

1480 IRRADIATE FIRST POLYMER COATING WITH UV LASER LIGHT THROUGH FIRST CARRIER SUBSTRATE AND FIRST ADHESIVE, TO ABLATE FIRST POLYMER COATING SO AS TO TRANSFER MICROELECTRONICS DEVICE FROM FIRST CARRIER SUBSTRATE TO SECOND CARRIER SUBSTRATE VIA LASER LIFT-OFF

1490 WHILE TOP SURFACE OF MICROELECTRONICS DEVICE FACES FINAL SUBSTRATE, IRRADIATE SECOND POLYMER COATING WITH UV LASER LIGHT THROUGH SECOND CARRIER SUBSTRATE AND SECOND ADHESIVE, TO ABLATE SECOND POLYMER COATING SO AS TO TRANSFER MICROELECTRONICS DEVICE FROM SECOND CARRIER SUBSTRATE TO FINAL SUBSTRATE VIA LASER LIFT-OFF

FIG. 14

MICROELECTRONIC DEVICE TRANSFER WITH UV-TRANSMISSIVE ADHESIVE AND LASER LIFT-OFF

CROSS-REFERENCE TO RELATED APPLICATIONS

This application is a national stage application under 35 U.S.C. § 371 of International Application No. PCT/EP2022/050274, filed Jan. 7, 2022, which claims the priority of U.S. Provisional Application No. 63/139,660 filed on Jan. 20, 2021, the entire contents of each priority application is incorporated herein by reference.

FIELD OF THE DISCLOSURE

The present invention relates in general to inter-substrate transfer of microelectronic devices, in particular to inter-substrate transfer processes aided by laser lift-off.

BACKGROUND OF THE DISCLOSURE

Consumers are continuously demanding thinner and lighter electronic devices with higher performance, such as thinner displays with higher resolution and high-resolution displays incorporating microsensors. To meet these demands, the microelectronics industry is pushing toward making ever smaller microelectronic devices. For example, micro light-emitting diodes (microLEDs) less than 70 microns×70 microns in size and as small as about 3 microns×3 microns are being developed for the purpose of making high-resolution LED displays. MicroLED displays are an emerging display technology expected to offer higher brightness, lower power consumption, and faster response than organic LED displays and liquid-crystal displays.

Wafer-level manufacturing has long been the most cost-effective mass-production method for microelectronic devices, with the capability to manufacture millions of identical microelectronic devices simultaneously on the same wafer. In this context, laser processing has several attractive properties such as non-contact mode of operation, selective and flexible application, and more easily managed environmental hazards than wet chemistry processing.

Although it is at least in some situations possible to separate out individual microelectronic devices from a wafer by dicing the wafer, thinner form factors may be achieved by instead detaching the microelectronic devices from the wafer. Therefore, wafer-level manufacturing of microelectronic devices may involve one or more steps of detaching the microelectronic devices from a substrate. For example, the microelectronic devices may be grown at high density on a growth wafer and then implemented at lower density in a final device, possibly in conjunction with other types of microelectronic devices. The production of microelectronic devices also often involves processing of both the top and the bottom of the microelectronic devices after growing at least some layers of the microelectronic devices on a growth wafer. Such double-sided post-growth processing may require one or more operations of transferring the micro-electronic devices from one substrate to another in order to flip them over. Additionally, pick-and-place technology may be used to replace faulty microelectronic devices on either a final substrate (e.g., a substrate with an active matrix) or an intermediate substrate.

Laser lift-off has emerged as a promising transfer technology. The laser lift-off process releases a microelectronic device from a substrate by irradiating an intervening layer such as gallium nitride (GaN), located between the substrate and the microelectronic device, with laser light sufficiently powerful to ablate the intervening layer. Laser lift-off typically utilizes ultraviolet light generated by an excimer laser, and a microelectronic device may be released from a substrate by a single laser pulse. Laser lift-off may be applied selectively to either a single individual microelectronic device or to a subset of the total number of microelectronic devices on a substrate. Alternatively, laser lift-off is applied to all microelectronic devices on the same substrate. In laser lift-off of several microelectronic devices, the laser beam may be scanned across relevant portions of a substrate to release microelectronic devices one by one, or a larger-area laser pulse may be applied to multiple microelectronic devices simultaneously.

Transfer of microelectronic devices may utilize laser lift-off in a stamp-based transfer scheme, a bond-release scheme, or a laser-induced forward transfer scheme. In the stamp-based scheme, microelectronic devices are released from a donor substrate by laser lift-off, and picked up from the donor substrate by an elastomer stamp. The stamp then places the microelectronic devices on a receiver substrate. In the bond-release scheme, the microelectronic devices are bonded to the receiver substrate before being released from the donor substrate. In the laser-induced forward transfer scheme, the receiver substrate is held a distance from the microelectronic devices, and the ablation of the intervening layer not only releases the microelectronic devices from the donor substrate but also propels the microelectronic devices across the gap to the receiver substrate. Each of these schemes may be applied to a single microelectronic device or several microelectronic devices.

SUMMARY OF THE DISCLOSURE

While the miniaturization of wafer-level microelectronic devices marches forward, challenges exist to at least some of the actual implementations intended. Inter-substrate transfer processes are proving difficult and, in many cases, present an obstacle to integration of the microelectronic devices in consumer electronics devices. For example, microLED displays are not yet ready for the consumer electronics market at least in part due to challenges around inter-substrate microLED transfers. Existing microLED display manufacturing processes generally involves several transfer steps, including mass-transfer and also pick-and-place replacements of faulty microLEDs.

Disclosed herein are microelectronic device transfer methods that combine the convenience of adhesives for picking up microelectronic devices with the efficient, flexible, selective, and clean properties of laser lift-off for releasing the microelectronic devices. The present approach is suitable for both mass-transfer and pick-and-place, and may be applied to the manufacture and implementation of a variety of microelectronic devices, for example the manufacture of microLEDs and their implementation in microLED displays.

In one scenario, where the presently disclosed microelectronic device transfer methods are useful, the adhesive has been selected to have certain favorable properties but happens to be transmissive to ultraviolet light, thereby leaving the microelectronic devices vulnerable to damage during laser lift off. For example, the adhesive may be selected to have the right amount of adhesion, so the devices remain attached during process steps, but can then be removed therefrom without damage, and the adhesive may be selected to be robust against damage by UV radiation. The adhesive may be a silicone-based polymer adhesive. The presently disclosed microelectronic device transfer methods incorporate an ultraviolet-absorptive polymer coating that prevents damaging levels of ultraviolet light from being transmitted by an ultraviolet-transmissive adhesive to the microelectronic devices during laser lift off.

In one aspect, a method for inter-substrate transfer of microelectronic devices includes steps of (a) applying a polymer coating to a top surface of a microelectronic device located on a first substrate, wherein the top surface faces away from the first substrate and a bottom surface of the microelectronic device faces the first substrate, (b) depositing an ultraviolet-transmissive adhesive on a second substrate, (c) contacting the polymer-coated top surface of the microelectronic device to the adhesive to bond the microelectronic device to the second substrate, (d) detaching the microelectronic device from the first substrate, and (e) irradiating, while the bottom surface of the microelectronic device faces a third substrate, the polymer coating with ultraviolet laser light through the second substrate and the adhesive, to ablate the polymer coating so as to transfer the microelectronic device from the second substrate to the third substrate via laser lift-off.

BRIEF DESCRIPTION OF THE DRAWINGS

The accompanying drawings, which are incorporated in and constitute a part of the specification, schematically illustrate preferred embodiments of the present invention, and together with the general description given above and the detailed description of the preferred embodiments given below, serve to explain principles of the present invention.

FIGS. 2A and 2B illustrate a bond-release method for laser lift-off transfer of a microelectronic device from an adhesive surface of one substrate to another substrate, according to an embodiment.

FIGS. 3A and 3B illustrate a method for laser-induced forward transfer of a microelectronic device from an adhesive surface of one substrate to another substrate, according to an embodiment.

FIG. 10 illustrates a selective transfer method for inter-substrate transfer of microelectronic devices, according to an embodiment. The method utilizes laser lift-off in conjunction with an adhesive transmissive to ultraviolet light.

FIG. 11 is a diagram indicating a sub-portion of neighboring microelectronic devices, of an array of microelectronic devices, selected for mass transfer from a substrate, according to an embodiment.

FIG. 12 is a diagram indicating a sampling of microelectronic devices selected for mass transfer, according to an embodiment.

FIG. 14 is a flowchart for another method for inter-substrate transfer of microelectronic devices via two intermediate carrier substrates, according to an embodiment.

DETAILED DESCRIPTION OF THE DISCLOSURE

Figure 1:
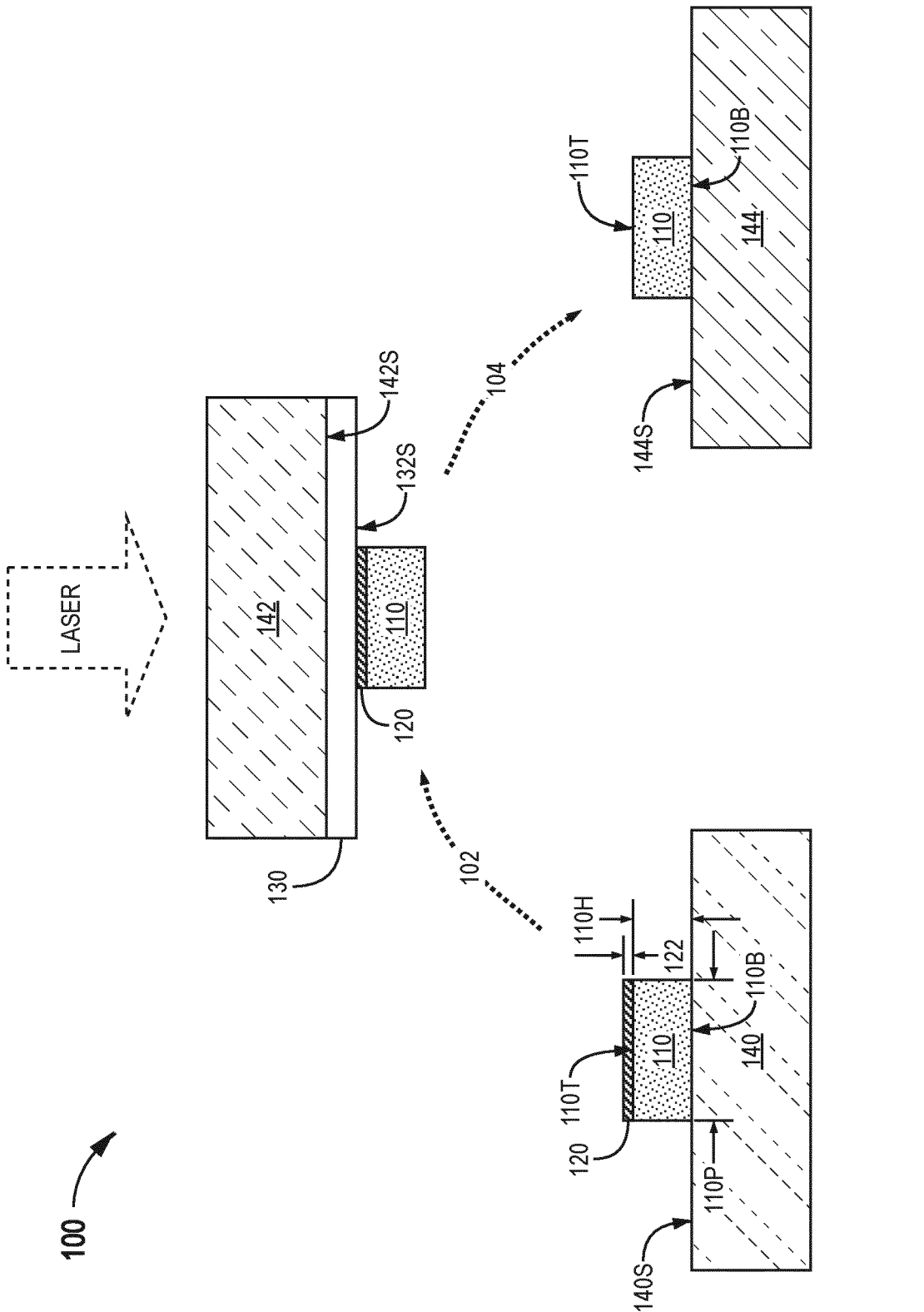
FIG. 1 illustrates a method for inter-substrate transfer of microelectronic devices, according to an embodiment. The method utilizes laser lift-off in conjunction with an adhesive transmissive to ultraviolet light.

Referring now to the drawings, wherein like components are designated by like numerals, FIG. 1 illustrates one method 100 for inter-substrate transfer of microelectronic devices. Method 100 utilizes laser lift-off in conjunction with an adhesive transmissive to ultraviolet light. Method 100 includes a step 102 of transferring a microelectronic device 110 from a substrate 140 to a substrate 142, and a step 104 of transferring device 110 from substrate 142 to a substrate 144.

Herein, a microelectronic device refers to a device that includes one or more functional semiconductor regions or layers, for example semiconductor regions or layers that are positively or negatively doped compared to their adjacent regions or layers. The microelectronic device may or may not be a completed, fully operational microelectronic device. For example, additional processing steps to complete device 110 may be performed after the completion of method 100 and/or while device 110 is situated on any one of substrates 140, 142, and 144. Device 110 is, for example, a microLED, a photodiode, a complementary metal oxide semiconductor circuit, or a capacitive micromachined ultrasonic transducer.

The dimensions of the microelectronic device are less than about 100-200 microns and typically, but not necessarily, greater than about 0.1 microns. In one embodiment, device 110 is a microLED that, upon commencement of method 100, is complete or needs further processing to be fully operational. Device 110 may have a height 110H of tens of microns or less and transverse extent 110P of between 1 and 100 microns in dimensions parallel to substrate 140. Height 110H may be less than 20% of transverse extent 110P.

A receiving surface 142S of substrate 142 is covered by an adhesive 130. Substrate 142 and adhesive 130 can withstand and are transmissive to ultraviolet light. Substrate 142 may be a quartz, sapphire, or other substrate characterized by high UV transmission. Device 110 has a top surface 110T and a bottom surface 110B. When device 110 is in its initial location on a surface 140S of substrate 140, top surface 110T faces away from substrate 140 and bottom surface 110B faces towards substrate 140. Top surface 110T is covered by a polymer coating 120 that is absorptive to ultraviolet light. Step 102 transfers device 110 to substrate 142 by contacting polymer coating 120 to a surface 132S of adhesive 130 and detaching device 110 from substrate 140. Method 100 allows for processing of bottom surface 110B of device 110 while device 110 is secured to substrate 142 by adhesive 130. Step 104 utilizes laser lift-off to transfer device 110 from substrate 142 to a receiving surface 144S of substrate 144. The laser lift-off is achieved by laser ablating polymer coating 120, or at least a portion thereof, to release device 110 from adhesive 130. Step 104 therefore does not need to overcome the adhesive forces of adhesive 130 that facilitate step 102. Upon transfer to substrate 144, device 110 may simply rest on receiving surface 144S, or bond to receiving surface 144S via, e.g., an adhesive or solder.

Without departing from the scope hereof, additional material may be deposited on top of polymer coating 120, such that polymer coating 120 is in only indirect contact with adhesive 130. When polymer coating 120 is ablated, such additional material is detached from device 110 and not transferred with device 110 to substrate 144. For the purpose of minimizing the number of process steps, it may be advantageous not to deposit such additional material on polymer coating 120. However, method 100 does not preclude the existence of such additional material. The remainder of the present disclosure discusses embodiments that do not have additional material on top of the polymer coatings. However, in each instance herein where a polymer coating is bonded to an adhesive, it is understood that additional material may have been deposited on the polymer coating, such that the polymer coating is in only indirect contact with the adhesive.

Polymer coating 120 is, for example, made of parylene and/or triazene, or another polymer composition that has sufficient UV absorption and can be applied sufficiently thin to be fully ablated with a single UV laser pulse. The thickness 122 of polymer coating 120 may be in the range between 1 and 150 nanometers. Thickness 122 may be chosen to provide sufficient propulsion during lift off, while still facilitating full removal of polymer coating 120 with a single ultraviolet laser pulse. There are advantages associated with a relatively thin polymer coating 120. These advantages include faster deposition of polymer coating 120, especially if using chemical vapor deposition which may be too time consuming for deposition of a thicker coating. Thus, in certain embodiments, thickness 122 is in the range between 1 and 50 nanometers.

Adhesive 130 may be a silicone-based polymer adhesive, or another material that can withstand UV light and remains tacky over elongated time periods.

FIGS. 2A and 2B illustrate one bond-release method 200 for laser lift-off transfer of a microelectronic device from an adhesive surface of a donor substrate to a receiver substrate. Method 200 is an embodiment of step 104 of method 100. As shown in FIG. 2A, while top surface 110T of device 110 is bonded to adhesive 130, method 200 couples bottom surface 110B of device 110 to receiving surface 144S of substrate 144 such that device 110 is coupled between substrates 142 and 144. An ultraviolet laser beam 290 then irradiates polymer coating 120 through substrate 142 and adhesive 130. Laser beam 290 thereby ablates polymer coating 120 (or at least a portion thereof) to release device 110 from substrate 142 so as to complete the transfer of device 110 to substrate 144, as shown in FIG. 2B where a gap 250 exists in the place where polymer coating 120 was before ablation.

FIGS. 3A and 3B illustrate one method 300 for laser-induced forward transfer of a microelectronic device from an adhesive surface of a donor substrate to a receiver substrate. Method 300 is an embodiment of step 104 of method 100. As shown in FIG. 3A, method 300 positions substrates 142 and 144 such that bottom surface 110B of device 110 faces receiving surface 144S of substrate 144, with a gap 370 therebetween. Laser beam 290 then irradiates polymer coating 120 through substrate 142 and adhesive 130. Laser beam 290 thereby ablates polymer coating 120

(or at least a portion thereof) to both release device 110 from substrate 142 and propel device 110 across gap 370 to surface 144S of substrate 144 so as to complete the transfer of device 110 to substrate 144, as shown in FIG. 3B.

In each of methods 200 and 300, an ultraviolet laser beam 290 may be generated by a pulsed laser 292 (depicted schematically in FIG. 2A), and the laser lift-off process may be performed by a pulse of laser beam 290. Laser 292 is, for example, an excimer laser. The wavelength of laser beam 290 may be in the range between 190 to 420 nanometers.

Method 200 possibly offers greater reliability than method 300 in terms of bonding device 110 to substrate 144, since at least a preliminary bond to substrate 144 may be completed while device 110 is clamped between substrates 142 and 144. On the other hand, method 300 allows for transfer of device 110 to substrate 144 when existing structures, such as structure 380, makes it impossible to bring substrates 142 and 144 sufficiently close to each other to avoid a gap 370. Structure 380 is, for example, another microelectronic device. In one scenario, method 300 is used to make a color microLED display using different microLEDs color types, e.g., red, green, and blue microLEDs. In this scenario, each different color type is initially grown on a separate growth substrate and the different color types must be brought together at least on the final display substrate. As a result, at least some of the microLEDs must be transferred to a target location on a substrate that already holds one or more other microLEDs close to the target location. In this situation, it may not be possible to use method 200, but method 300 is still a viable option.

Referring now to FIGS. 1, 2, and 3 in combination, regardless of whether method 100 performs step 104 according to method 200 or method 300, polymer coating 120 may have two purposes. In addition to providing material for ablation, i.e., forming a dynamic release layer, polymer coating 120 may serve to protect device 110 from damaging exposure to laser beam 290. Thickness 122 of polymer coating 120 (indicated in FIG. 1) may be set to cooperate with the parameters of laser beam 290, e.g., beam size and pulse energy, such that irradiation with laser beam 290 stops after a sufficient portion of polymer coating 120 is ablated away and before the exposure of device 110 to laser beam 290 exceeds a damage level. In one embodiment, thickness 122 and the parameters of laser beam 290 are tuned such that step 104 ablates substantially all of polymer coating 120 while keeping the exposure of device 110 to laser beam 290 below a damage level. For example, step 104 may remove polymer coating 120 from at least 90% of top surface 110T. In scenarios where device 110 is a microLED, it may be undesirable to leave residual polymer coating 120 obscuring top surface 110T. In such scenarios, step 104 may remove polymer coating 120 from all of top surface 110T or at least 98% of top surface 110T.

Without departing from the scope hereof, method 100 may implement chemical removal methods, such as etching, to remove residual polymer coating from top surface 110T.

Bonding of device 110 to substrate 144 in step 104 (implemented according to either one of methods 200 or 300) may utilize bonding methods known in the art, such as soldering or van der Walls forces. In one embodiment, surface 144S of substrate 144 has an adhesive deposited thereon. This adhesive may be similar to adhesive 130.

Figure 4:
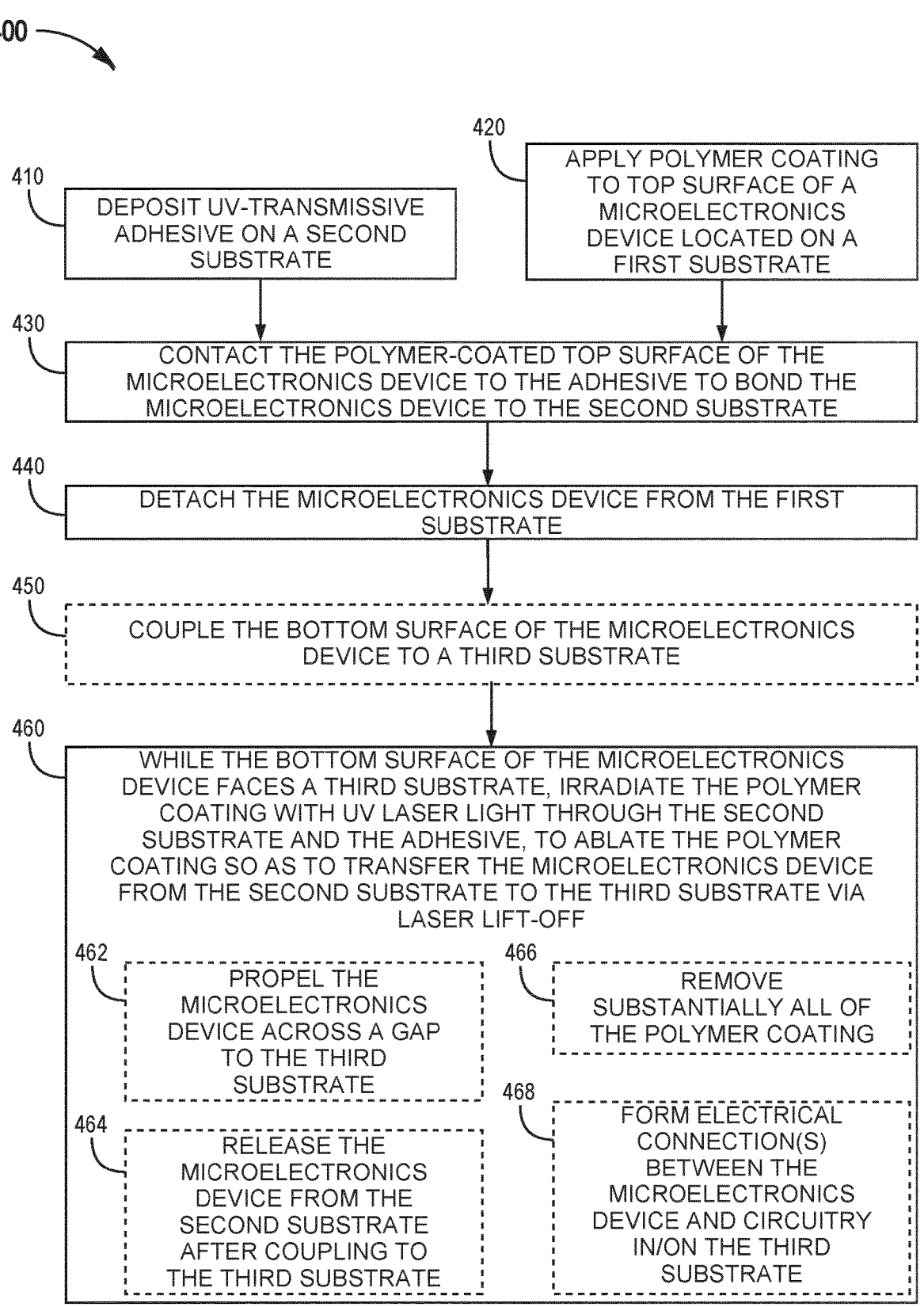
FIG. 4 is a flowchart for another method for inter-substrate transfer of microelectronic devices, according to an embodiment. The method utilizes laser lift-off in conjunction with an adhesive transmissive to ultraviolet light.

FIG. 4 is a flowchart for another method 400 for inter-substrate transfer of microelectronic devices. Method 400 utilizes laser lift-off in conjunction with an adhesive transmissive to ultraviolet light. Method 400 includes steps 410, 420, 430, 440, and 460. Method 400 may be applied to a variety of microelectronic devices, for example microLEDs. Method 400 transfers a microelectronic device from a first substrate, via a second substrate, to a third substrate.

Step 410 deposits an adhesive, transmissive to ultraviolet light, on a second substrate. In one example of step 420, adhesive 130 is deposited on surface 142S of substrate 140. Step 420 applies a polymer coating to a top surface of a microelectronic device located on a first substrate. In one example of step 410, polymer coating 120 is deposited on top surface 110T of device 110 while located on substrate 140. Polymer coating 120 may also coat other exposed surfaces of device 110 and/or substrate 140.

Step 430 contacts the polymer-coated top surface of the microelectronic device to the adhesive, to bond the microelectronic device to the second substrate. In one example of step 430, polymer coating 120 on top surface 110T of device 110 is contacted to adhesive 130 on surface 142S of substrate 142, so as to bond device 110 to substrate 142. Step 440 detaches the microelectronic device from the first substrate. In one example of step 440, device 110 is detached from substrate 140. Step 440 may utilize laser lift-off or another detachment method known in the art. Steps 430 and 440 may cooperate to form an embodiment of step 102 of method 100. When step 430 is performed before step 440 and step 440 utilizes laser lift-off, steps 430 and 440 form a bond-release implementation of step 102. Without departing from the scope hereof, a laser lift-off version of step 440 may instead be performed before but almost simultaneously with step 430, in which case steps 430 and 440 cooperate to form a laser-induced forward transfer implementation of step 102. In certain embodiments, the microelectronic device is bonded to the first substrate via an ultraviolet-transmissive adhesive. In such embodiments, steps 430 and 440 may be performed according to either one of methods 200 and 300.

Step 460 is performed while the bottom surface of the microelectronic device faces a third substrate. Step 460 irradiates the polymer coating with ultraviolet laser light. The irradiation takes place through the second substrate and the adhesive deposited thereon. The ultraviolet laser light ablates the polymer coating to transfer the microelectronic device from the second substrate to the third substrate via laser lift-off. In one example of step 460, device 110 is transferred from substrate 142 to substrate 144.

In a bond-release embodiment of method 400, method 400 includes a step 450 that precedes step 460, and step 460 implements a step 464. Step 450 couples the bottom surface of the microelectronic device to the third substrate before laser lift-off in step 460. Step 464 then releases the microelectronic device from the second substrate after that the microelectronic device has been coupled to the third substrate in step 450. FIGS. 2A and 2B illustrate one example of this bond-release embodiment of method 400.

In a laser-induced forward transfer embodiment of method 400, step 460 includes a step 462 and is not preceded by step 450. Step 462 propels the microelectronic device across a gap to the third substrate. FIGS. 3A and 3B illustrate one example of this laser-induced forward transfer embodiment of method 400.

Step 460 may include a step 466 of removing substantially all of the polymer coating, for example as discussed above for polymer coating 120. Without departing from the scope hereof, method 400 may implement chemical removal methods, such as etching, to remove residual polymer coating from the top surface of the microelectronic device.

Optionally, step 460 includes a step 468 of forming electrical connections between the microelectronic device and electronic circuitry located in and/or on the third substrate. The electronic circuitry is configured to operate the microelectronic device. In the case of a microLED, the electronic circuitry may be configured to activate the microLED. In one example, bottom surface 110B of device 110 includes one or more electric contacts, and surface 144S of substrate 144 includes complementary electric contact(s), such that each electrical contact at bottom surface 110B connects with the complementary electrical contact on surface 144S when device 110 is transferred to substrate 144. Solder or another conductive bond material may be disposed on the electric contacts of bottom surface 110B and/or on the electric contacts of surface 144S to help form the electrical connections. The electrical connections may be completed according to methods known in the art, such as reflow, during or after step 460.

Figure 5:
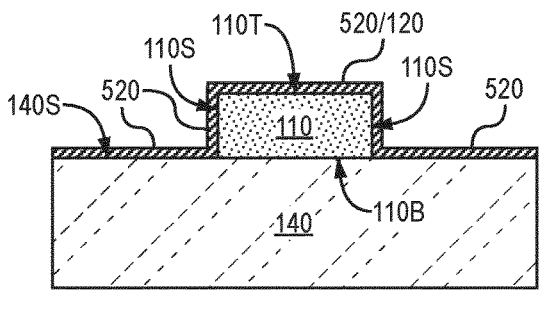
FIG. 5 illustrates a conformal polymer coating, according to an embodiment.

FIG. 5 illustrates one conformal polymer coating 520. Conformal polymer coating 520 includes polymer coating 120 on top surface 110T, and further covers sides 1105 of device 110 and at least adjacent unoccupied portions of surface 140S. Sides 1105 are surfaces of device 110 that span between top surface 110T and bottom surface 110B. In one embodiment, conformal polymer coating 520 covers all unoccupied portions of surface 140S as well as any other structures located on surface 140S. For example, when substrate 140 is a wafer or carrier substrate that accommodates many instances of device 110, conformal polymer coating 520 may cover top surfaces 110T and sides 1105 of each device 110 as well as all unoccupied portions of surface 140S (except, optionally, from peripheral regions of surface 140S away from any of devices 110).

Figure 6:
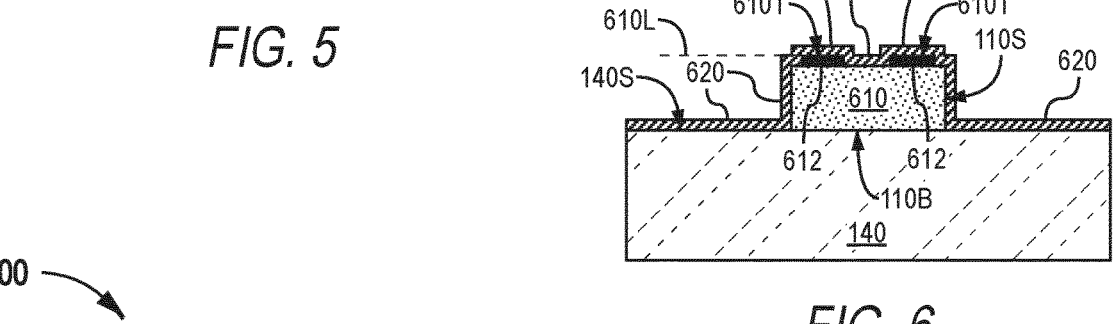
FIG. 6 illustrates a conformal polymer coating that covers the top surface of a microelectronic device having a non-planar top side, according to an embodiment.

FIG. 6 illustrates one conformal polymer coating 620 that covers the top surface 610T of a microelectronic device 610 having a nonplanar top side. Device 610 is an embodiment of device 110 that includes one or more features 612 protruding from the top side of device 610 in the direction away from bottom surface 110B. Each feature 612 may be an electric contact. Herein, the top surface of a microelectronic device, having a nonplanar top side, refers to surface elements most distant from bottom surface 110B. The top surface 610T of device 610 is composed of the surface portions at the level 610L indicated by a dashed line. These are the surface portions that will bond to adhesive 130 in step 430 of method 400. Conformal polymer coating 620 includes polymer coating 120 on each feature 612, and also covers the remainder of the top side of device 610 as well as sides 1105 of device 610 and at least adjacent unoccupied portions of surface 140S.

Each of conformal polymer coatings 520 and 620 may be deposited in step 420 of method 100 by a coating process known in the art, for example chemical vapor deposition. Conformal polymer coatings, such as conformal polymer coatings 520 and 620, are generally easier to apply than a patterned coating covering only the top surface of the microdevices. A conformal coating will be deposited on any exposed surface of the wafer and the microelectronic devices thereon.

Figure 7:
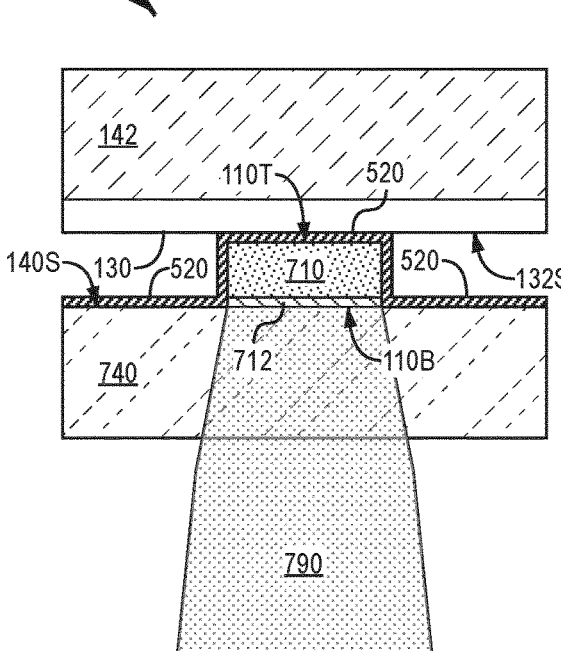
FIG. 7 illustrates a laser lift-off method for detaching a microelectronic device from a substrate, according to an embodiment.

FIG. 7 illustrates one laser lift-off method 700 for detaching a microelectronic device from a substrate. Method 700 is an embodiment of step 440 of method 400 and is applied to a microelectronic device 710 located on a substrate 740 that is transmissive to ultraviolet light. Substrate 740 may be a growth substrate, such as a sapphire substrate. Device 710 includes a bottom layer 712 forming bottom surface 110B. Bottom layer 712 may be a dynamic release layer composed of a different material than the portion of device 710 directly above bottom layer 712. Alternatively, bottom layer 712 may be a sacrificial layer that is not distinct from the portion of device 710 directly above bottom layer 712. For example, bottom layer 712 may be made of GaN. In method 700, an ultraviolet laser beam 790 irradiates bottom layer 712, through substrate 740, to ablate bottom layer 712 and thereby detach device 710 from substrate 740. Laser beam 790 may have properties similar to those of laser beam 290. Although FIG. 7 shows method 700 in a bond-release scheme, method 700 may instead be executed in a laser-induced forward transfer scheme.

Figure 8:
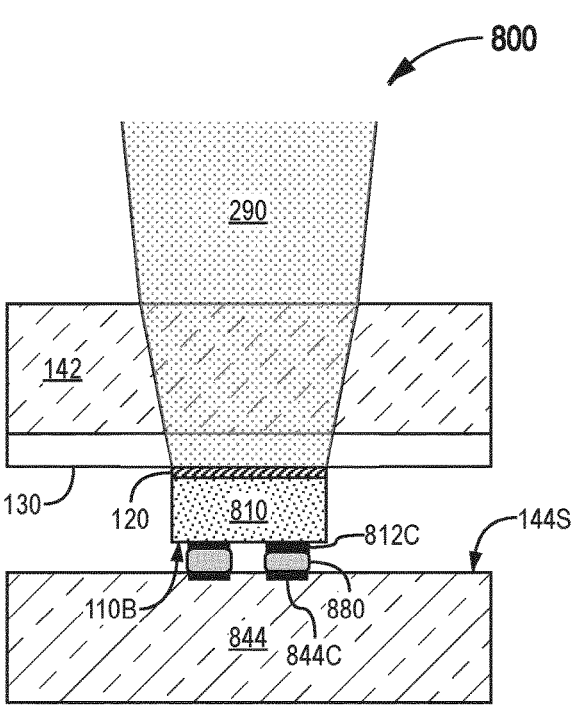
FIG. 8 illustrates a transfer method that forms electrical connections between the microelectronic device and the receiver substrate, according to an embodiment.

FIG. 8 illustrates one transfer method 800 that forms electrical connections between the microelectronic device and the receiver substrate. Method 800 is an example of step 460 of method 400 implementing step 468. Method 800 transfers a microelectronic device 810 from adhesive 130 on substrate 142 to a substrate 844 that includes electrical circuitry. Device 810 and substrate 844 are embodiments of device 110 and substrate 144, respectively. Microelectronic device 810 has one or more electrical contacts 812C on or at bottom surface 110B, and substrate 844 has one or more complementary electrical contacts 844C on or at surface 144S. Electrical contacts 812C are connected to electrical contacts 844C (optionally via solder or other conductive bond material 880), and laser beam 290 irradiates polymer coating 120 to release device 810 from adhesive 130 via laser lift-off. When performed in a bond-release scheme, method 800 may complete the electrical connections between electrical contacts 812C and 844C before, during, or after laser lift-off of device 810 from substrate 142. When performed in a laser-induced forward transfer scheme, method 800 completes the electrical connections between electrical contacts 812C and 844C upon or after electrical contacts 812C come into contact with electrical contacts 844C (optionally via solder or other conductive bond material 880).

Without departing from the scope hereof, each of devices 710 and 810 may have a nonplanar top side, for example in a manner similar to that of device 610.

Figure 9:
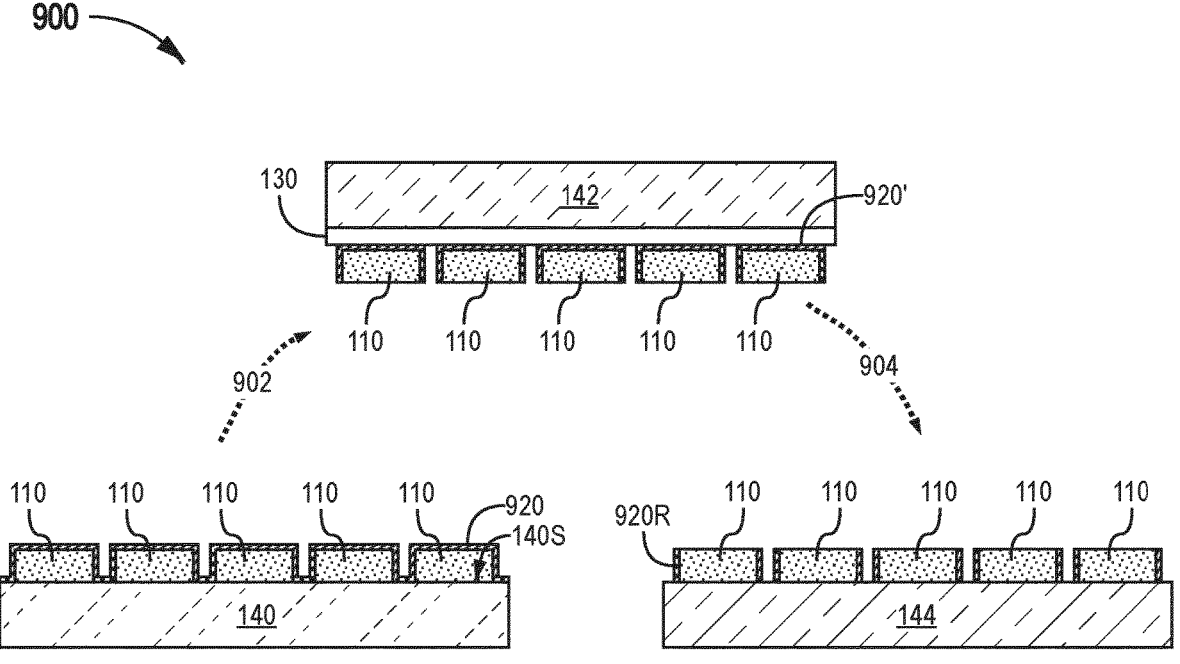
FIG. 9 illustrates a mass-transfer method for inter-substrate transfer of microelectronic devices, according to an embodiment. The method utilizes laser lift-off in conjunction with an adhesive transmissive to ultraviolet light.

FIG. 9 illustrates one mass-transfer method 900 for inter-substrate transfer of microelectronic devices. Method 900 utilizes laser lift-off in conjunction with an adhesive transmissive to ultraviolet light. Method 900 is an extension of method 100 that is applied to multiple microelectronic devices 110. Method 900 includes a step 902 of transferring multiple microelectronic devices 110 from substrate 140 to substrate 142, and a step 904 of transferring the multiple devices 110 from substrate 142 to substrate 144. All devices 110 and adjacent unoccupied portions of surface 140S of substrate 140 are covered by a conformal polymer coating 920, for example similar to conformal polymer coating 520 or 620. Devices 110 may be arranged in a two-dimensional array on substrate 140.

Step 902 transfers devices 110 to adhesive 130 in a single transfer operation. Step 902 may utilize any of the transfer methods discussed above for transfer of a single device 110 from substrate 140 to adhesive 130 on substrate 142. For example, step 902 may implement laser lift-off to release devices 110 from substrate 140, using a scanning laser beam to release devices 110 one-by-one (or in series of groups) or a large-area laser beam to release all devices in a single exposure. When devices 110 are transferred to substrate 142, portions of conformal polymer coating 920 not located on surfaces of one of devices 110 are unlikely to be transferred. As a result, when devices 110 are bonded to adhesive 130, conformal polymer coating 920 has likely been reduced to polymer coating portions 920' on surfaces of devices 110.

Step 904 transfers devices 110 to substrate 144 in a single transfer operation. Step 904 may utilize any of the laser lift-off transfer methods discussed above for transfer of a single device 110 from adhesive 130 on substrate 142 to substrate 144. When performing laser lift-off, step 904 may use a scanning laser beam to release devices 110 one-by-one (or in series of groups) or a large-area laser beam to release all devices in a single exposure. After completion of step 904, residual polymer coating 920R may exist, for example on sides 1105 (see FIG. 5) of devices 110.

Method 400 may be extended to mass-transfer of multiple microelectronic devices in a manner similar to the extension of method 100 to method 900.

FIG. 10 illustrates one selective transfer method 1000 for inter-substrate transfer of microelectronic devices. Method 1000 utilizes laser lift-off in conjunction with an adhesive transmissive to ultraviolet light. Method 1000 is an extension of method 100 where step 102 is extended to multiple microelectronic devices 110. Method 1000 includes step 902 of transferring multiple microelectronic devices 110 from substrate 140 to substrate 142 (as discussed above in reference to FIG. 9), and a step 1004 of transferring a single selected device 1010 of the multiple devices 110 from substrate 142 to substrate 144. Step 1004 may utilize any of the laser lift-off transfer methods discussed above for transfer of a single device 110 from adhesive 130 on substrate 142 to substrate 144.

As will be discussed in further detail below, in a modification of method 1000, the selective transfer is applied to more than one of devices 110, but not all devices 110.

FIG. 11 is a diagram indicating a sub-portion 1110 of neighboring microelectronic devices 110, of an array of microelectronic devices 110, selected for mass transfer from a substrate 1100. Method 1000 may be modified to selectively mass-transfer sub-portion 1110 in step 1004. In one example, the ablating laser beam is scanned through sub-portion 1110 to release devices 110 thereof one-by-one. In another example, the ablating laser beam is a larger-area laser beam sized to release all devices 110 of sub-portion 1110 in a single exposure.

FIG. 12 is a diagram indicating a sampling 1210 of microelectronic devices 110 selected for mass transfer. An array of devices 110 are located on substrate 1100 at a pitch 1270. Sampling 1210 has a pitch 1272 that is greater than pitch 1270. This sampling scheme is useful when the desired density of devices 110 on the receiver substrate is less than the density of devices 110 on the donor substrate.

Without departing from the scope hereof, step 902 of either one of method 900 or method 1000 may be modified to implement the selective transfer schemes illustrated in FIGS. 10-12.

Method 400 may be extended to selective transfer of one or more microelectronic devices from the second to the third substrate and/or from the first substrate to the second substrate, according to any one of the schemes discussed above in reference to FIGS. 10-12.

Figure 13:
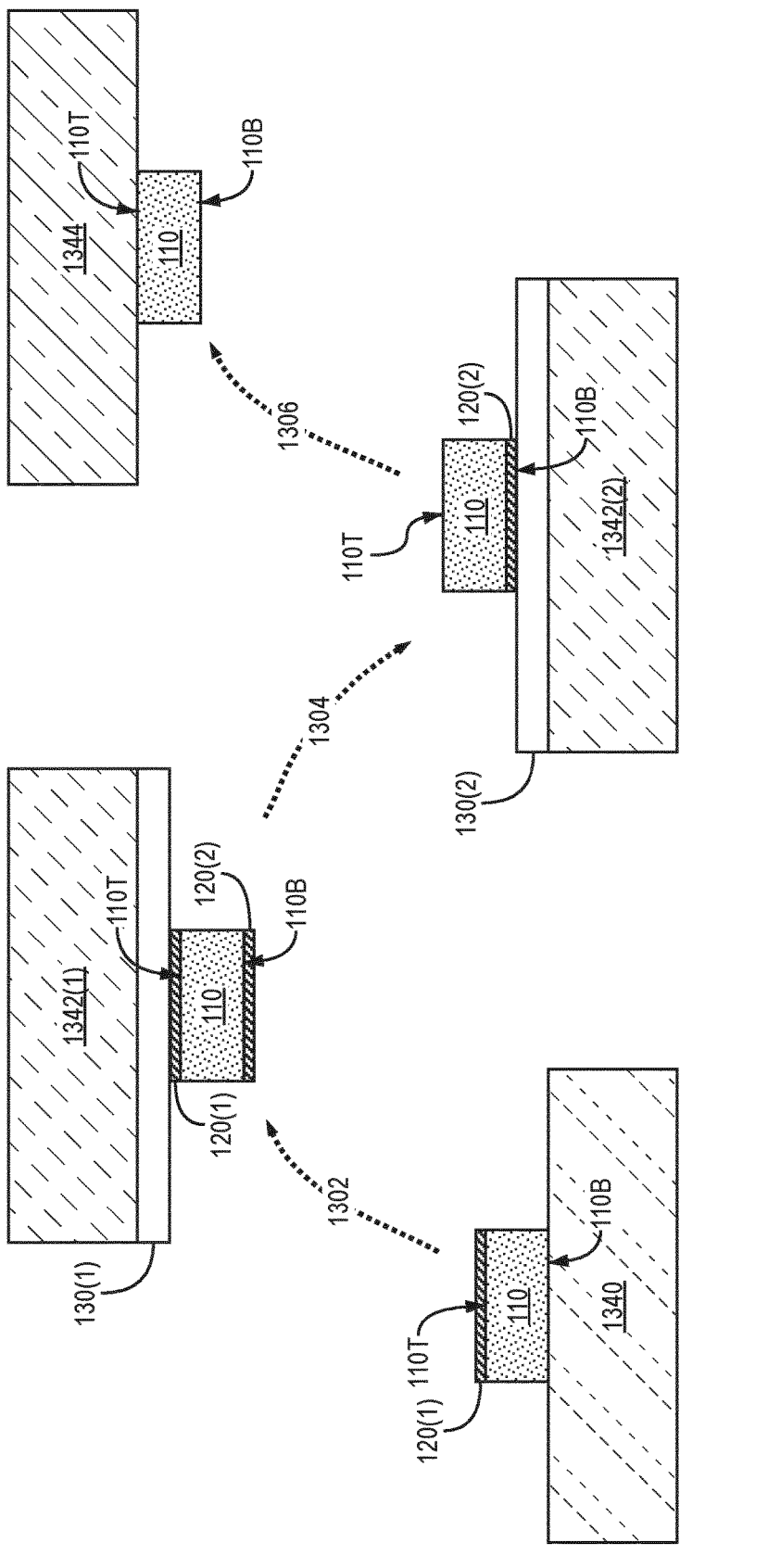
FIG. 13 illustrates a method for transferring a microelectronic device from a growth substrate to a final substrate via two adhesive intermediate carrier substrates, according to an embodiment.

FIG. 13 illustrates one method 1300 for transferring microelectronic device 110 from a growth substrate 1340 to a final substrate 1344 via two adhesive-covered intermediate carrier substrates 1342(1) and 1342(2). Growth substrate 1340 may be a sapphire substrate. Carrier substrates 1342(1) and 1342(2) may be quartz, sapphire, or other substrates characterized by high UV transmission. Final substrate 1344 may include electrical circuitry used to operate device 110. In one scenario, device 110 is a microLED configured to form one or more electrical connections between top surface 110T and substrate 1344.

Initially, device 110 is located on growth substrate 1340 with top surface 110T facing away from growth substrate 1340 and with a first polymer coating 120(1) on top surface 110T. Each carrier substrate 1342(1) and 1342(2) is overlaid with a respective adhesive 130(1) and 130(2). Method 1300 includes three transfer steps: a step 1302 of transferring device 110 from growth substrate 1340 to adhesive 130(1) on carrier substrate 1342(1), a step 1304 of transferring device 110 from adhesive 130(1) on carrier substrate 1342 (1) to adhesive 130(2) on carrier substrate 1342(2), and a step 1306 of transferring device 110 from adhesive 130(2) on carrier substrate 1342(2) to substrate 1344. Between transfer steps 1302 and 1304, method 1300 applies a second polymer coating 120(2) to bottom surface 110B.

Each of transfer steps 1302, 1304, and 1306 uses laser lift-off to release device 110 from the donor substrate. Step 1302 may be performed according to method 700. Step 1304 may be performed according to either one of the schemes illustrated in FIGS. 2A-3B, based on ablation of polymer coating 120(1) with laser irradiation through substrate 1342 (1) and adhesive 130(1), and resulting in device 110 being bonded to adhesive 130(2). Step 1306 may also be performed according to either one of the schemes illustrated in FIGS. 2A-3B, but based on ablation of polymer coating 120(2) with laser irradiation through substrate 1342(2) and adhesive 130(2), and resulting in device 110 being transferred to substrate 1344.

Each polymer coating 120(1) and 120(2) may be a conformal coating, for example similar to conformal polymer coating 520 or 620, and device 110 may be similar to any one of devices 610, 710, and 810. Method 1300 may include forming electrical connections between top surface 110T and substrate 1344, for example as discussed above in reference to FIG. 8. Method 1300 may also include (a) processing bottom surface 110B (other than applying polymer coating 120(2)) while device 110 is located on carrier substrate 1342(1) and/or (b) processing top surface 110T while device 110 is located on carrier substrate 1342(2). Such processing may include forming electrical contacts or otherwise modifying the functionality of device 110. Additionally, method 1300 may include testing the function of device 110 before one or more of steps 1302, 1304, and 1306, and proceeding with the next transfer step only if the test outcome is satisfactory.

FIG. 14 is a flowchart for another method 1400 for inter-substrate transfer of microelectronic devices via two intermediate carrier substrates. Method 1400 utilizes laser lift-off in conjunction with adhesives transmissive to ultraviolet light. Method 1400 includes steps 1410, 1420, 1430, 1440, 1450, 1460, 1470, 1480, and 1490. Method 1400 may be applied to a variety of microelectronic devices, for example microLEDs.

Steps 1410 and 1420 are preparation steps for transfer of the microelectronic device from a growth substrate to a first carrier substrate (e.g., preparation for step 1302 of method 1300). Step 1410 deposits a first adhesive, transmissive to ultraviolet light, on a first carrier substrate. In one example of step 1420, adhesive 130(1) is deposited on substrate 1342(1). Step 1420 applies a first polymer coating to a top surface of a microelectronic device located on a growth substrate. In one example of step 1420, polymer coating 120(1) is applied top surface 110T of device 110 while located on substrate 1340. Polymer coating 120(1) may also coat other exposed surfaces of device 110 and/or substrate 1340.

After completion of steps 1410 and 1420, method 1400 proceeds to transfer the microelectronic device from the growth substrate to the first carrier substrate (e.g., perform step 1302 of method 1300). Step 1430 contacts the polymer-coated top surface of the microelectronic device to the first adhesive, to bond the microelectronic device to the first carrier substrate. In one example of step 1430, polymer coating 120(1) on top surface 110T of device 110 is contacted to adhesive 130(1) on substrate 1342(1), so as to bond device 110 to substrate 1342(1). Step 1440 detaches the microelectronic device from the growth substrate. In one example of step 1440, device 110 is detached from substrate 1340. Step 1440 utilizes laser lift-off, for example as discussed above in reference to FIG. 7. Steps 1430 and 1440 cooperate to form an embodiment of step 1302 of method 1300.

When step 1430 is performed before step 1440, steps 1430 and 1440 cooperate to transfer the microelectronic device in bond-release scheme. Alternatively, step 1440 may be performed before but almost simultaneously with step 1430, in which case steps 1430 and 1440 cooperate to transfer the microelectronic device in a laser-induced forward transfer scheme.

After completion of step 1440, method 1400 proceeds to perform steps 1450 and 1460 to prepare for transfer of the microelectronic device from the first carrier substrate to the second carrier substrate (e.g., prepare for step 1304 of method 1300). Step 1450 applies a first polymer coating to a bottom surface of the microelectronic device while located on the first carrier substrate. The bottom surface is a surface of the microelectronic device that faced the growth substrate while the microelectronic device was made thereon. In one example of step 1450, polymer coating 120(2) is applied to bottom surface 110B of device 110 while located on substrate 1342(1). Polymer coating 120(2) may also coat other exposed surfaces of device 110 and/or substrate 1342(1). Step 1460 deposits a second adhesive, transmissive to ultraviolet light, on a second carrier substrate. In one example of step 1460, adhesive 130(2) is deposited on substrate 1342 (2).

After completion of steps 1450 and 1460, method 1400 proceeds to perform steps 1470 and 1480 to transfer the microelectronic device from the first carrier substrate to the second carrier substrate (e.g., perform step 1304 of method 1300). Steps 1470 and 1480 are performed while the bottom surface of the microelectronic device faces the second carrier substrate. Step 1470 contacts the polymer-coated bottom surface of the microelectronic device to the second adhesive, to bond the microelectronic device to the second carrier substrate. More specifically, step 1470 bonds the second polymer coating on the microelectronic device to the second adhesive on the second carrier substrate. In one example of step 1470, polymer coating 120(2) on bottom surface 110B of device 110 is contacted to adhesive 130(2) on substrate 1342(2), so as to bond device 110 to substrate 1342(2). Step 1480 irradiates the first polymer coating with ultraviolet laser light. The irradiation takes place through the first carrier substrate and the first adhesive deposited thereon. The ultraviolet laser light ablates the first polymer coating to transfer the microelectronic device from the first carrier substrate to the second carrier substrate via laser lift-off. In one example of step 1480, device 110 is transferred from substrate 1342(1) to substrate 1342(2).

When step 1470 is performed before step 1480, steps 1470 and 1480 cooperate to transfer the microelectronic device in bond-release scheme, in a manner similar to that illustrated in FIGS. 2A and 2B. Alternatively, step 1480 may be performed before but almost simultaneously with step 1470, in which case steps 1470 and 1480 cooperate to transfer the microelectronic device in a laser-induced forward transfer scheme in a manner similar to that illustrated in FIGS. 3A and 3B. Step 1480 may remove the second polymer coating from at least 90% of the top surface of the microelectronic device.

After completion of steps 1470 and 1480, method 1400 proceeds to step 1490 of transferring the microelectronic device from the second carrier substrate to the final substrate (e.g., performing step 1306 of method 1300). Step 1490 is performed while the top surface of the microelectronic device faces the final substrate. Step 1490 irradiates the second polymer coating with ultraviolet laser light. The irradiation takes place through the second carrier substrate and the second adhesive. The ultraviolet laser light ablates the second polymer coating to transfer the microelectronic device from the second carrier substrate to the final substrate via laser lift-off. In one example of step 1490, device 110 is transferred from substrate 1342(2) to substrate 1344. Step 1490 is similar to step 460 of method 400, except for the microelectronic device being upside-down with respect to the substrates in step 1490 as compared to in step 460. Step 1490 may be performed in a bond-release scheme, for example as illustrated in FIGS. 2A and 2B, or in a laser-induced forward transfer scheme, for example as illustrated in FIGS. 3A and 3B. Step 1490 may include forming electrical connections between the microelectronic device and circuitry in and/or on the final substrate. In one scenario, the final substrate is an active matrix substrate configured to operate the microelectronic device. In scenarios where the microelectronic device is a microLED, it may be undesirable to leave residual polymer coating obscuring the bottom surface. In such scenarios, step 1490 may remove the second polymer coating from all of the bottom surface or at least 98% of the bottom surface.

Without departing from the scope hereof, each of methods 1300 and 1400 may implement chemical removal methods, such as etching, to remove residual polymer coating from the bottom and/or top surfaces of the microelectronic device after the transfer steps.

Each of methods 1300 and 1400 is readily extended to mass transfer or selective transfer, with any one of the transfers steps being performed according to the methods discussed above in reference to FIGS. 9-12.

The present invention is described above in terms of a preferred embodiment and other embodiments. The invention is not limited, however, to the embodiments described and depicted herein. Rather, the invention is limited only by the claims appended hereto.

What is claimed is:

1. A method for inter-substrate transfer of microelectronic devices, comprising steps of:

applying a polymer coating to a top surface of a microelectronic device located on a first substrate, the top surface facing away from the first substrate and a bottom surface of the microelectronic device facing the first substrate;

depositing an ultraviolet-transmissive adhesive on a second substrate;

contacting the polymer-coated top surface of the microelectronic device to the adhesive to bond the microelectronic device to the second substrate;

detaching the microelectronic device from the first substrate; and irradiating, while the bottom surface of the microelectronic device faces a third substrate, the polymer coating with ultraviolet laser light through the second substrate and the adhesive, to ablate the polymer coating so as to transfer the microelectronic device from the second substrate to the third substrate via laser lift-off.

2. The method of claim 1, wherein the microelectronic device is a light-emitting diode.

3. The method of claim 2, wherein:

the top surface of the microelectronic device is an emissive surface of the light-emitting diode, and the third substrate is a final substrate including electrical circuitry for activating the light-emitting diode; and the irradiating step includes removing the polymer coating from at least 98% of the top surface of the microelectronic device.

4. The method of claim 1, wherein the second substrate includes quartz or sapphire.

5. The method of claim 1, wherein the irradiating step includes ablating the polymer coating while there is a gap between the microelectronic device and the third substrate, and wherein ablation of the polymer coating propels the microelectronic device across the gap to the third substrate.

6. The method of claim 5, wherein the applying step includes forming the polymer coating with a thickness, on the top surface of the microelectronic device, in the range between 1 and 50 nanometers.

7. The method of claim 1, comprising:

coupling the microelectronic device to the third substrate; and performing the irradiating step while the microelectronic device is coupled to the third substrate.

8. The method of claim 1, wherein the irradiating step includes removing the polymer coating from at least 90% of the top surface of the microelectronic device.

9. The method of claim 8, wherein:

the applying step includes forming the polymer coating with a thickness, on the top surface of the microelectronic device, of no more than 150 nanometers; and the irradiating step uses a single laser pulse to remove the polymer coating from the at least 90% of the top surface of the microelectronic device.

10. The method of claim 1, wherein the applying step includes depositing the polymer coating by chemical vapor deposition.

11. The method of claim 1, wherein the irradiating step includes generating the ultraviolet laser light with an excimer laser.

12. The method of claim 1, wherein the polymer coating includes at least one of parylene and triazene.

13. The method of claim 1, wherein the third substrate is a final substrate including electrical circuitry for operating the microelectronic device.

14. The method of claim 1, wherein:

the applying step includes applying the polymer coating to the top surface of a plurality of instances of the microelectronic device located on the first substrate;

the contacting step includes contacting the polymer-coated top surface of the plurality of microelectronic devices to the second substrate;

the detaching step includes detaching the plurality of microelectronic devices from the first substrate; and the irradiating step includes irradiating the polymer coating associated with each of the plurality of microelectronic devices to transfer the plurality of microelectronic devices to the third substrate.

15. The method of claim 1, wherein:

the applying step includes applying the polymer coating to the top surface of a plurality of instances of the microelectronic device located on the first substrate;

the contacting step includes contacting the polymer-coated top surface of the plurality of microelectronic devices to the second substrate;

the detaching step includes detaching the plurality of microelectronic devices from the first substrate; and the irradiating step includes irradiating the polymer coating associated with only a single one of the plurality of microelectronic devices to transfer only the single microelectronic device to the third substrate.

16. The method of claim 1, wherein:

the applying step includes applying the polymer coating to the top surface of an array of instances of the microelectronic device located on the first substrate;

the contacting step includes contacting the polymer-coated top surface of the plurality of microelectronic devices to the second substrate;

the detaching step includes detaching the plurality of microelectronic devices from the first substrate; and the irradiating step includes irradiating the polymer coating associated with only a subset of the plurality of microelectronic devices to transfer only the subset to the third substrate, the subset being either (a) every one of the microelectronic devices within a sub-portion, of the array, consisting of neighboring microelectronic devices or (b) a sampling of the microelectronic devices at a pitch that is greater than pitch of the array.

17. The method of claim 1, wherein:

the first substrate is a growth substrate for the microelectronic device, and a semiconductor release layer is located between the microelectronic device and the growth substrate; and the detaching step includes ablating the semiconductor release layer with laser light, irradiating the semiconductor release layer through the growth substrate, to detach the microelectronic device from the growth substrate via laser lift-off.

18. The method of claim 17, wherein:

the second substrate is a first carrier substrate and the third substrate is a second carrier substrate;

the method further includes, before the irradiating step, steps of:

applying a second polymer coating to the bottom surface of the microelectronic device while bonded to the first carrier substrate, and depositing an ultraviolet-transmissive adhesive on the second carrier substrate; and the irradiating step transfers the microelectronic device to the second carrier substrate such that the second polymer coating on the microelectronic device is bonded to the adhesive on the second carrier substrate.

19. The method of claim 18, further comprising, while the top surface of the microelectronic device faces a final substrate, irradiating the second polymer coating with ultraviolet laser light, through the second carrier substrate and the adhesive deposited thereon, to ablate the second polymer coating so as to transfer the microelectronic device from the second carrier substrate to the final substrate via laser lift-off.

20. The method of claim 19, further comprising completing one or more electrical connections between the microelectronic device and circuitry in or on the final substrate.

* * * * *